(12) United States Patent
Sharav et al.

(10) Patent No.: US 9,775,243 B2
(45) Date of Patent: Sep. 26, 2017

(54) MODULE COMPLIANCE BOARDS FOR QUAD SMALL FORM-FACTOR PLUGGABLE (QSFP) DEVICES

(71) Applicant: Mellanox Technologies, Ltd., Yokneam (IL)

(72) Inventors: Boris Sharav, Yokneam (IL); Yonatan Malkiman, Kfar Yehezkel (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 46 days.

(21) Appl. No.: 14/690,428

(22) Filed: Apr. 19, 2015

(65) Prior Publication Data

US 2016/0309576 A1 Oct. 20, 2016

(51) Int. Cl.
*H05K 1/11* (2006.01)
*H05K 1/02* (2006.01)
*H05K 1/09* (2006.01)

(52) U.S. Cl.
CPC .......... *H05K 1/111* (2013.01); *H05K 1/0213* (2013.01); *H05K 1/0298* (2013.01); *H05K 1/09* (2013.01); *H05K 1/115* (2013.01); *H05K 2201/0723* (2013.01)

(58) Field of Classification Search
CPC ........ H05K 1/112; H05K 1/113; H05K 1/114; H05K 1/115; H05K 1/116
See application file for complete search history.

(56) References Cited

U.S. PATENT DOCUMENTS

| 7,645,944 | B2 * | 1/2010 | Casher ................. H05K 1/0219 174/261 |
| 7,705,246 | B1 * | 4/2010 | Pritchard ............. H05K 1/0222 174/262 |
| 8,035,992 | B2 * | 10/2011 | Kushta .............. H01L 23/49827 174/262 |
| 2013/0177309 | A1 | 7/2013 | El-Ahmadi et al. |
| 2013/0273766 | A1 | 10/2013 | Lindkamp |
| 2014/0079403 | A1 | 3/2014 | Daghighian et al. |
| 2015/0023671 | A1 | 1/2015 | Bradley et al. |

\* cited by examiner

*Primary Examiner* — Jeremy C Norris
(74) *Attorney, Agent, or Firm* — Mark M. Friedman

(57) ABSTRACT

An optimized ground (GND) network connection is provided between a Quad Small Form-factor Pluggable (QSFP) connector and a printed circuit board (PCB). The optimized GND network creates a "GND Island" around the signal pads by adding GND cage around the signal pads (at the empty corridor and in front of QSFP pads) and GND TH (ground through hole) vias from both sides of signal pads (at the empty corridor and in front of QSFP pads).

19 Claims, 10 Drawing Sheets

MODULE COMPLIANCE BOARDS FOR QUAD SMALL FORM-FACTOR PLUGGABLE (QSFP) DEVICES

TECHNICAL FIELD

The present invention is directed to PCBs (printed circuit board) for Quad Small Form-factor Pluggable (QSFP) devices.

BACKGROUND

Quad Small Form-factor Pluggable (QSFP) devices are compact, hot-pluggable transceivers used for data communications applications. These transceivers interface networking hardware to a fiber optic cable.

QSFP is an industry format jointly developed and supported by many network component vendors, allowing among others data rates from 4×10 Gbit/s. The format specification is evolving to enable higher data rates, and of May 2013, the highest possible rate is 4×28 Gbit/s, while the rate is in the process of continuous growth to higher rates.

For example, contemporary QSFP boards experience high insertions loss deviation in terms of Amplitude (in decibels (dB)) or power, versus signal frequency (in Mega Hertz). This results in non-linear behavior, when graphed.

SUMMARY OF THE INVENTION

Embodiments of the present provide an optimized ground (GND) network connection between the QSFP connector and the PCB. The optimized GND network creates a "GND Island" around the signal pads by adding GND cage around the signal pads (at the empty corridor and in front of QSFP pads) and GND TH (ground through hole) vias from both sides of signal pads (at the empty corridor and in front of QSFP pads). Finally, the signal vias are micro vias from Layer 1 to Layer 2. As a result of this structure and design, ground inductance is minimized and alternate signal return paths are created. These features optimize electromagnetic performance, current distribution, and signal performance levels.

This structure also improves over the contemporary PCBs for QSFP devices, by providing a total loss in signal speed which is linear, without signal deviation.

Embodiments of the present invention are directed to a printed circuit board (PCB). The printed circuit board comprises: a first ground layer and a second ground layer and a signal layer between the first and second ground layers; at least one island surrounding at least two signal pads at the first ground layer, the signal pads in electrical communication with the second layer to define a current pathway; and, a plurality of vias extending from the first ground layer to the second ground layer to define an alternate current pathway.

Optionally, the at least one island includes a plurality of islands oppositely disposed from each other so as to be arranged in rows on the first ground layer to define a corridor intermediate the rows.

Optionally, the first ground layer includes at least one ground pad at the ends of the islands.

Optionally, the at least one ground pad includes a plurality of ground pads extending along the rows.

Optionally, the signal layer comprises: a conductor extending along the signal layer and aligned with the corridor of the first ground layer, and, a plurality of conductive leads aligned with a corresponding ground pad, and in electrical communication with the conductor and the corresponding ground pad.

Optionally, the printed circuit board additionally comprises: ground shielding vias extending between the first ground layer and the second ground layer.

Optionally, the plurality of vias include, a plurality of through holes for sinking current.

Optionally, the first ground layer and the third layer include a copper layer.

Optionally, the third ground layer includes a plurality of voids, each of the voids in electrical communication with the signal pad of the first ground layer.

Embodiments of the present invention are directed to a method for electric current circulation. The method comprises: obtaining a printed circuit board comprising: a first ground layer and a second ground layer and a signal layer between the first and second ground layers; at least one island surrounding at least two signal pads at the first ground layer, the signal pads in electrical communication with the second layer to define a current pathway; at least two ground pads disposed at opposite sides of the at least one island; and, a plurality of vias in electrical communication with the ground pads and extending from the first ground layer to the second ground layer to define an alternate current pathway. An electrical connector is then placed into electrical communication with the signal pads and the surface of the first ground layer; and, electrical current is passed through the connector, such that 1) current flow from the electrical pads to the signal layer defines a current pathway, and, 2) current flow through the plurality of vias extending from the first ground layer to the second ground layer defines an alternate current pathway.

Optionally, the method additionally comprises: sinking the electrical current by the plurality of vias.

The present invention is also directed to a printed circuit board (PCB). The printed circuit board comprises: a first ground layer and a second ground layer and a signal layer between the first and second ground layers; a plurality of islands, each of the islands surrounding at least two signal pads at the first ground layer, the signal pads in electrical communication with the second layer to define a current pathway, and the islands of the plurality of islands oppositely disposed from each other so as to be arranged in rows on the first ground layer to define a corridor intermediate the rows; and, a plurality of vias extending from the first ground layer to the second ground layer to define an alternate current pathway.

Optionally, the first ground layer includes at least one ground pad at the ends of the islands.

Optionally, the at least one ground pad includes a plurality of ground pads extending along the rows.

Optionally, the signal layer comprises ground cages, with the ground cages comprising: a conductor extending along the signal layer and aligned with the corridor of the first ground layer; and, a plurality of conductive leads aligned with a corresponding ground pad, and in electrical communication with the conductor and the corresponding ground pad.

Optionally, the printed circuit board additionally comprises: ground shielding vias extending between the first ground layer and the second ground layer.

Optionally, the plurality of vias include, a plurality of through holes for sinking current.

Optionally, the first ground layer and the third layer include a copper layer.

Optionally, the third ground layer includes a plurality of voids, each of the voids in electrical communication with the signal pad of the first ground layer.

Unless otherwise defined herein, all technical and/or scientific terms used herein have the same meaning as commonly understood by one of ordinary skill in the art to which the invention pertains. Although methods and materials similar or equivalent to those described herein may be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF DRAWINGS

Some embodiments of the present invention are herein described, by way of example only, with reference to the accompanying drawings. With specific reference to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Attention is now directed to the drawings, where like reference numerals or characters indicate corresponding or like components. In the drawings.

DETAILED DESCRIPTION OF THE DRAWINGS

Figure 1:
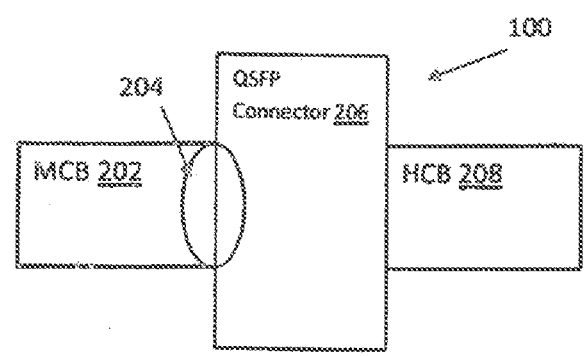
FIG. 1 is a diagram of the location of the PCB of the present invention in a QSFP device.

Before explaining at least one embodiment of the invention in detail, it is to be understood that the invention is not necessarily limited in its application to the details of construction and the arrangement of the components and/or methods set forth in the following description and/or illustrated in the drawings. The invention is capable of other embodiments or of being practiced or carried out in various ways.

FIG. 1 shows the present invention in an exemplary structure and operation, as a portion of a PCB module compliance board (MCB) 202 at the interface 204 thereof with a QSFP connector 206 on a QSFP device 100. The QSFP connector 206 also connects to a host compliance board (HCB) 208. This combination is, for example, in accordance with the Infinity Band Trade Association EDR Specifications and the IEEE 100G Specifications.

Figure 2:
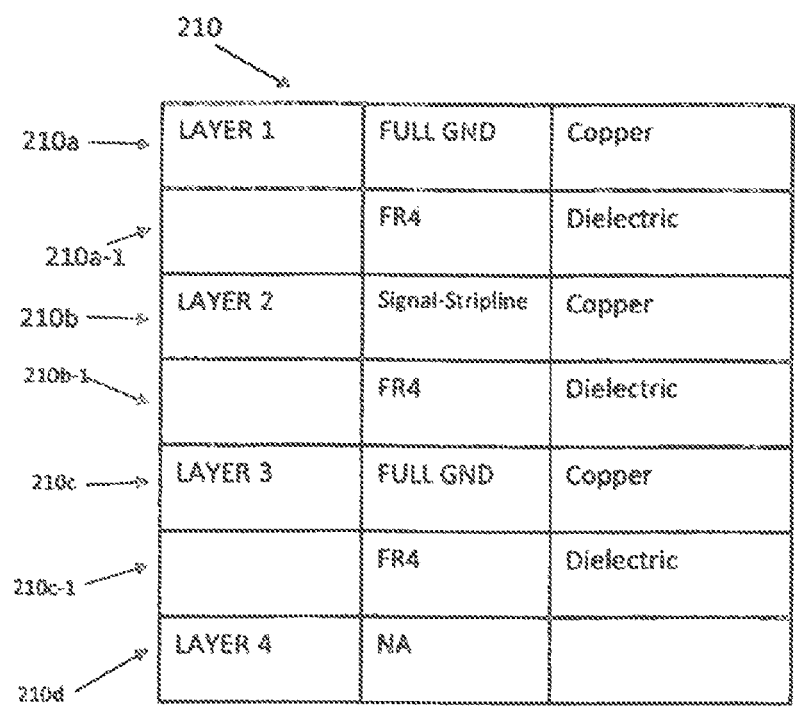
FIG. 2 is a diagram showing the layers of the PCB in accordance with embodiments of the present invention.

FIG. 2 shows a diagram of the MCB 202 at the interface 204, which is the PCB 210 in accordance with embodiments of the invention. The PCB 210 is layered and going from top or upper layer to bottom, or lower layer, in an exemplary orientation. Layer 1 210a is the top or upper layer, and is a Full Ground (GND), which encircles (surrounds) the signal pads; Layer 2 210b is an intermediate layer, and is a Signal-Stripline, and Layer 3 210c is the lower or base layer and is a Full GND. Layer 4 210d is representative of one or more additional layers, with Layers 1, 2 and 3 being the germane layers to the present invention.

Layers 1, 2 and 3 are, for example, of copper, with F4 dielectric materials, serving as insulators (insulating layers 210a-1, 210b-1, 210c-1), between each of Layers 1, 2, 3 and 4.

Figure 3A:
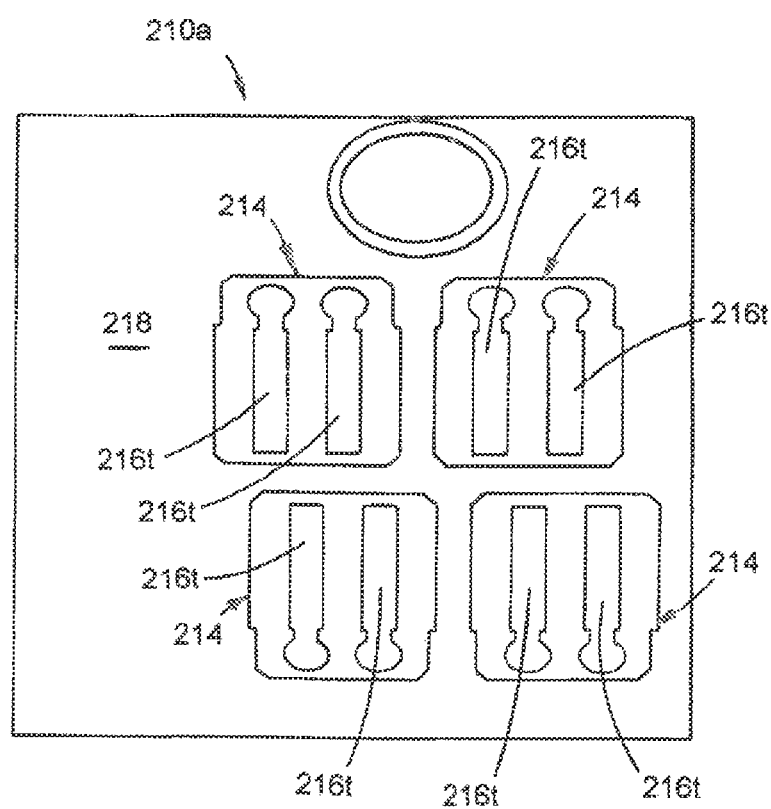
FIG. 3A is an illustration of Layer 1 of the PCB in accordance with embodiments of the present invention.
Figure 3B:
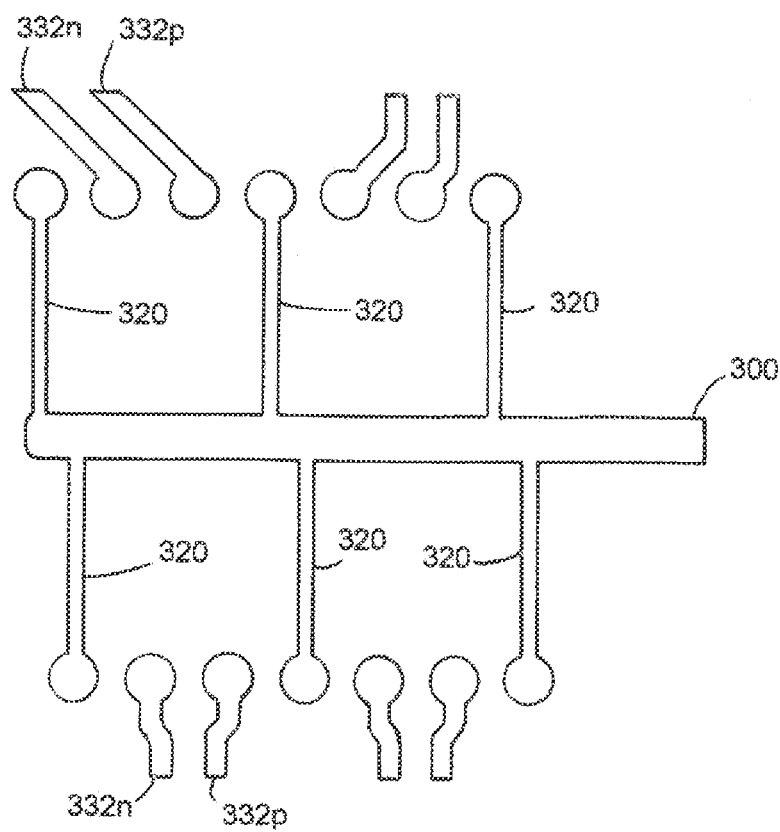
FIG. 3B is an illustration of Layer 2 of the PCB in accordance with embodiments of the present invention.
Figure 3C:
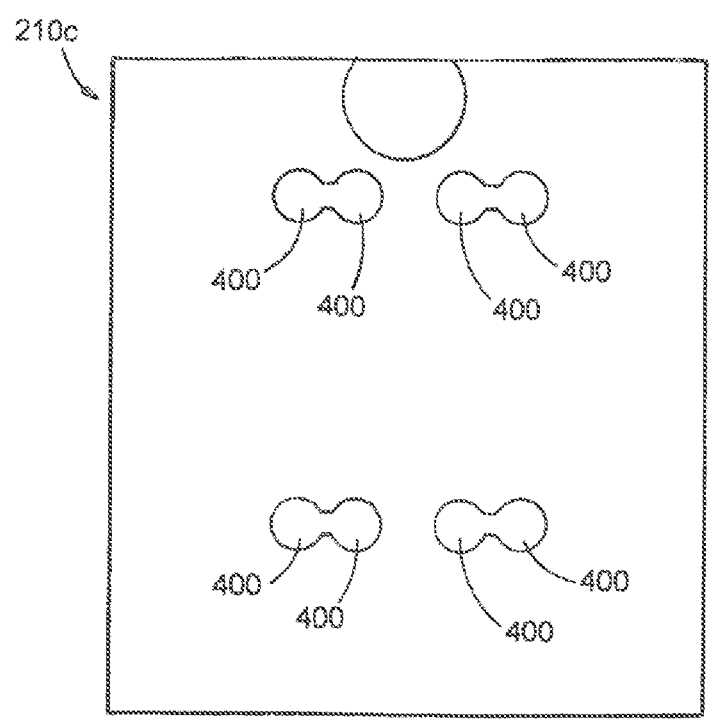
FIG. 3C is an illustration of Layer 3 of the PCB in accordance with embodiments of the present invention.

Attention is now directed to FIGS. 3A-3C, which show Layer 1 210a, Layer 2 210b and Layer 3 210c individually.

Figure 4:
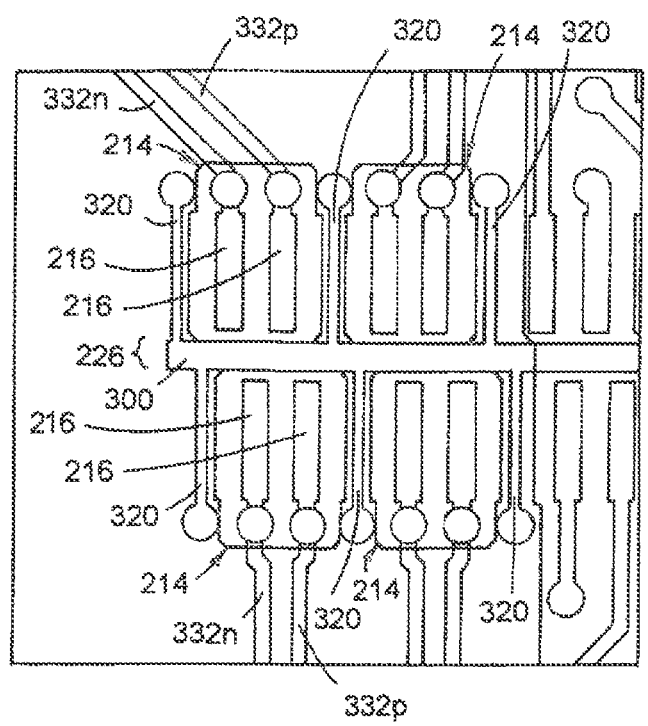
FIG. 4 is an illustration of Layers 1 and 2, showing the GND/Signal connections from Layer 1 to Layer 2 of the PCB in accordance with embodiments of the present invention.
Figure 6:
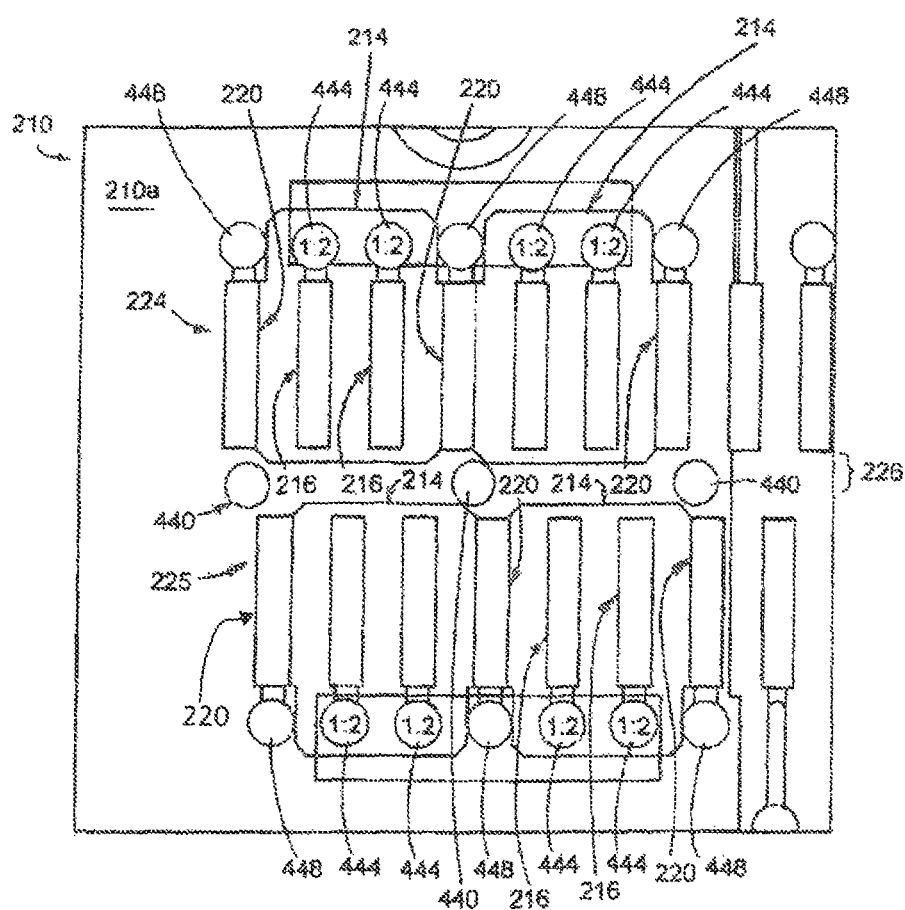
FIG. 6 is an illustration of Layer 1 showing the Signal/GND vias.

FIG. 3A shows the top or upper layer 210a, which serves as a ground layer for the PCB 210. The layer 210a includes islands 214 (also known as GND Islands) which encircle signal pad traces 216t (the signal pads 216 are shown in FIGS. 4 and 6). The islands 214 are placed over an electrically conductive layer 218, of copper (2 mills thickness), for example. The GND pads 220 (shown partly or fully in broken lines, for illustration purposes only) are at the ends (sides) of the islands 214, and shorted to the respective island 214. For example, the areas for the signal pads 216 are etched into the respective islands 214. The signal pads 216 and GND pads 220, are arranged in rows 224, 225 with a corridor 226 extending between the rows 224, 225, as shown in FIG. 6. This arrangement minimizes GND loops around the signal pads 216, which is achieved by the corridor 226 and a path in front of the signal pads 216.

FIG. 3B shows the middle layer, Layer 2 210b. A conductor 300 for electrical and signals, typically electrical signals, extends along a path corresponding to the corridor 226 of Layer 1 210a. Electrical connections or leads 320, of an electrically conductive material, such as copper, extend along the paths of the corresponding GND pads 220 of Layer 1 210a, and connect to the conductor 300. The conductor 300, coupled with the leads 320, forms a GND (ground) cage, which provides an additional path for electric current flow, thus improving connector performance (when a connector is attached to the PCB 210).

Paired traces 332n, 332p are designed to connect with the signal pads 216. These traces 332n, 332p are, for example, of an electrically and magnetically conductive material, such as copper and like, and typically only carry electrical signals. The corresponding signal pads 216 are of a differential pair of potentials, one of the pair 332n, 216 of an N potential and the other of the pair 332p, 216 of a P potential. The traces 332n, 332p of Layer 2 connect to the respective signal pads 216 of Layer 1 by micro vias 444 (FIG. 6), and define a strip line layer. This connection, i.e., the strip line layer, minimizes the signal by inductance and maintains continuity of Layer 1 and Layer 2 as a return current path.

FIG. 3C shows the third layer, Layer 3 210c, which also functions as a ground (GND) layer. This layer includes voids 400 corresponding to the signal pads 216 of Layer 1 210a and paired conductors 332p, 332n of Layer 2 210b. The voids 400 are such that they function to reduce capacitance of the respective signal pad 216. GND TH (through hole) vias 460 (FIG. 7B) extend between Layer 1 201a and Layer 3 210c, creating a GND network with Layer 1 210a and Layer 3 210c. With this structure in place, the return current flows from Layer 1 to Layer 3 by the GND TH vias 460 (FIG. 7B), as these four GND TH vias 460 allows the return current multiple return paths and serve as current sinks, as shown in FIG. 7B. Additionally, these GND TH vias 460 place Layer 1 210a in electrical communication with Layer 3 210c, creating a stable GND network, optimizing GND impedance and minimizing GND inductance. Accordingly, return current in the GND pads 220 follows the signal and flows to Layer 3 210c, instead of Layer 2 210b, this current flow being along a new or alternate path.

FIG. 4 shows the arrangement of Layer 1 210a, as joined to Layer 2 210b (looking with Layer 1 210a as the top layer), and in particular the GND cages of conductor 300, running along the corridor 226, as connected to the respective leads 320. The leads 320 connect with their corresponding GND pads 220 by wires which extend through vias (448 as shown in FIG. 6) in the top layer, e.g., Layer 1 210a. These wires connect the same DC potential pads at Layer 2 210b.

Figure 5:
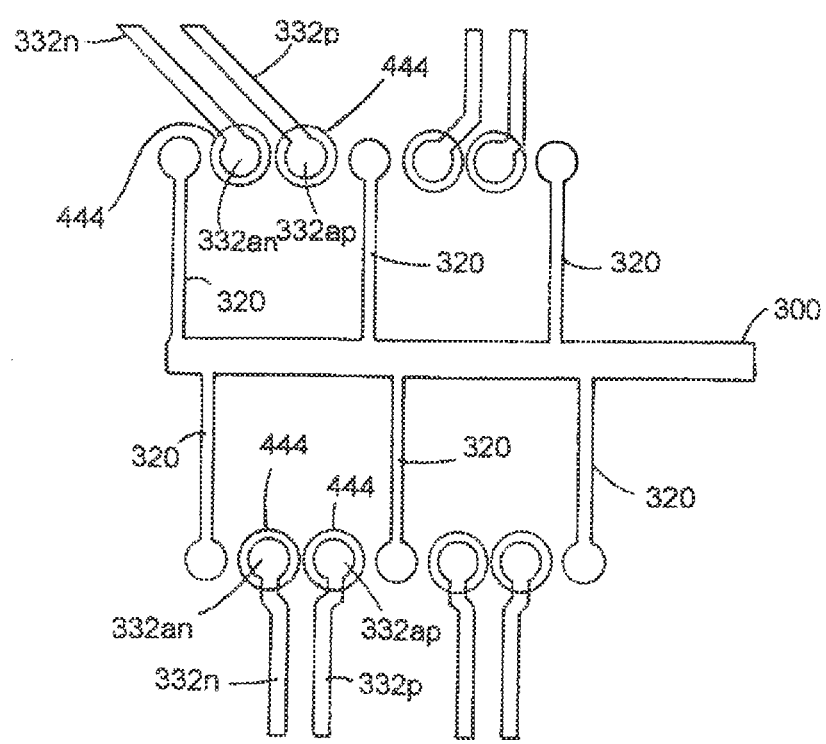
FIG. 5 is an illustration of Layers 2 and 3, showing the GND/Signal connections from Layer 2 to Layer 3 of the PCB in accordance with embodiments of the present invention.

FIG. 5 shows the arrangement of Layer 2 210b, as joined to Layer 3 210c (looking with Layer 2 210b as the top layer), and in particular the GND cages of conductor 300, running along the corridor 226, as connected to the respective leads 320. Additionally, the voids 400 terminate at the ends 332an, 332ap, of the respective conductors 332n, 332p.

FIG. 6 shows the PCB 210 from Layer 1 210a. GND "shielding" vias 440, 448 are placed at both sides of the GND pads 220, for each of the rows 224, 225. The GND shielding vias 440 at the corridor 226 are mutual vias for both rows 224, 225, and extend from Layer 1 210a to layer 2 210b. This placement of the GND Shielding vias 440, 448 is made for optimization of GND connection for the signal return path layers, i.e., Layer 1 210a and Layer 3 210c. These GND shielding vias 440, 448 create alternative current return paths for differential and common mode (typically, electrical) signals. The distance of GND TH vias 460 from the GND pads 220 is the minimal possible, in order to set the relations between GND loops at Layer 1 210a (FIG. 7A) and Layer 3 210c (FIG. 7B).

Figure 7A:
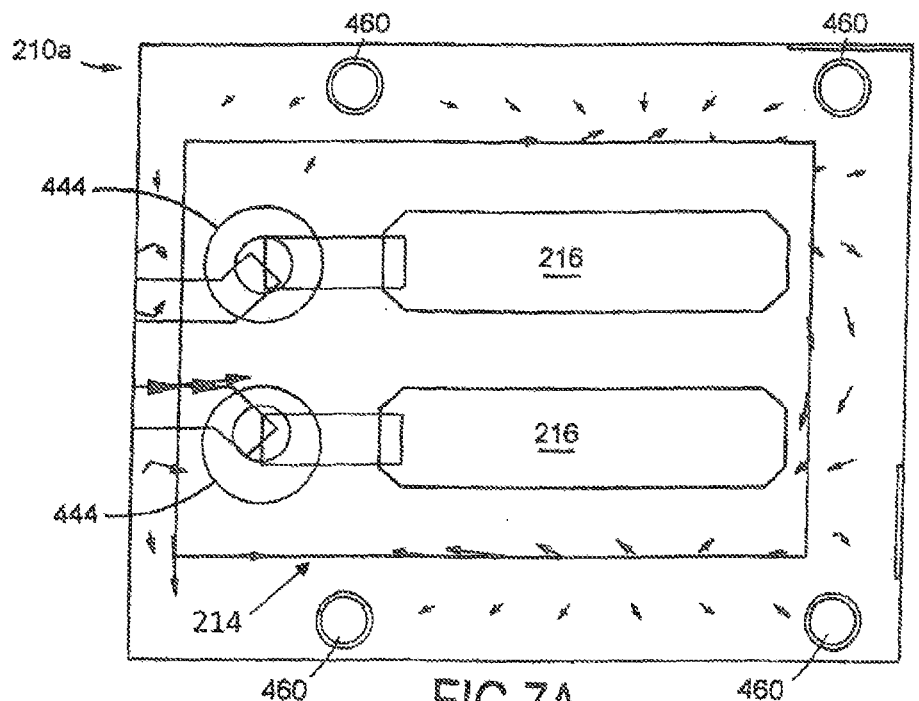
FIG. 7A is a diagram illustrating current circulation at Layer 1.
Figure 7B:
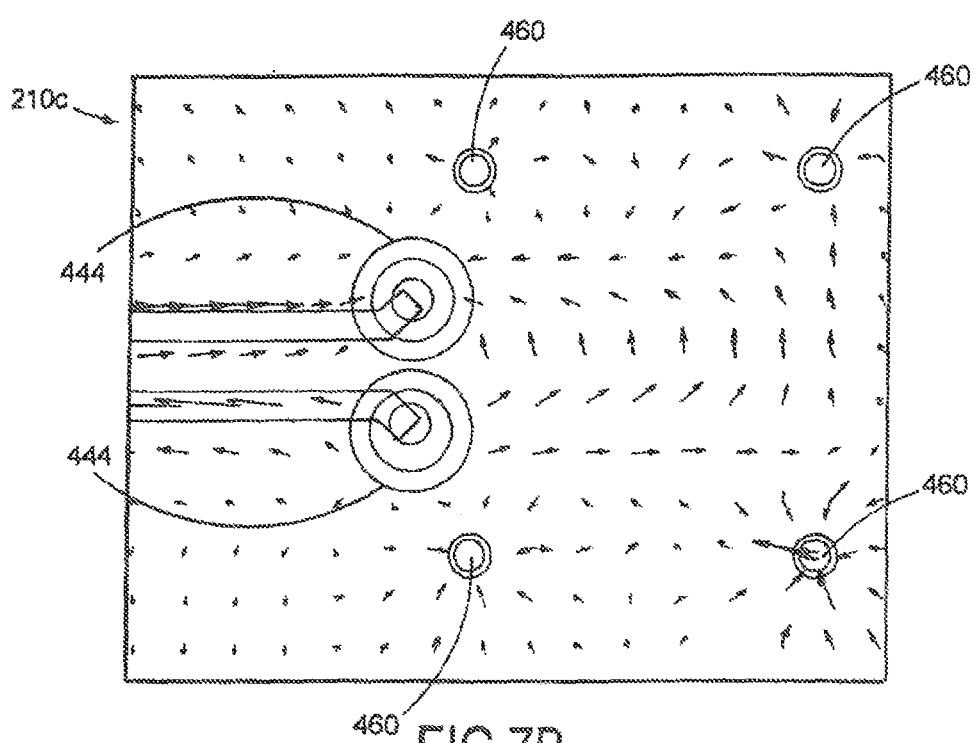
FIG. 7B is a diagram illustrating current circulation at Layer 3.

FIG. 7A shows a return current path (shown by the arrows) at Layer 1 210a. The island 214, allows for return current circulation (at a differential mode) around the signal pads 216 and removes GND inductance. The current circulation shown in this figure is at high frequency.

FIG. 7B shows a return current path at Layer 3 210c. The GND TH vias 460 carry the return current as an alternative path. The GND TH vias 460 serve as current sinks. The current is represented by the arrows. The current circulation shown in this figure is at high frequency.

Figure 8:
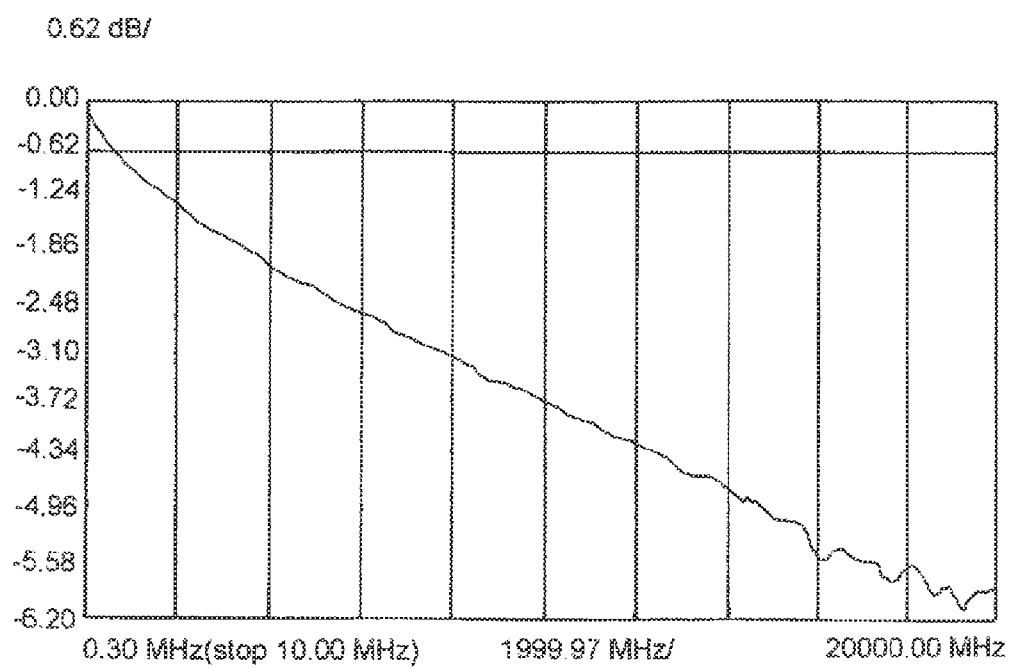
FIG. 8 is a diagram of connector insertion loss with the present invention.

FIG. 8 shows a graph of connector insertion loss, where the relationship between power and signal frequency is linear, for connectors which use (connect to) the PCB 210 of the present invention. This linearity is due to the optimized GND network and the alternate current path to GND by the GND cages, when current is passed through the connector/PCB 210 assembly.

As used herein, the singular form "a", "an" and "the" include plural references unless the context clearly dictates otherwise.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The invention claimed is:

1. A printed circuit board comprising:
a first ground layer and a second ground layer;
a signal layer between the first ground layer and the second ground layer;
the first ground layer including a plurality of oppositely disposed islands arranged in rows with a corridor between the rows of oppositely disposed islands, each said island surrounding at least two signal pads, the signal pads in electrical communication with the signal layer to define a current pathway, and a plurality of ground pads in each row at the ends of the islands in the direction of the row; and,
a plurality of ground through hole vias, each of the ground through hole vias in electrical communication with the ground pads, and each of the ground through hole vias extending from the first ground layer to the second ground layer, the ground through hole vias defining a current return pathway.

2. The printed circuit board of claim 1, wherein the signal layer comprises:
a conductor extending along the signal layer and aligned with the corridor of the first ground layer; and,
a plurality of conductive leads aligned with a corresponding said ground pad, and in electrical communication with the conductor and the corresponding said ground pad.

3. The printed circuit board of claim 2, additionally comprising: a plurality of ground shielding vias extending between the first ground layer and the second ground layer.

4. The printed circuit board of claim 1, wherein the plurality of the through hole vias include, a plurality of through holes configured for sinking current.

5. The printed circuit board of claim 1, wherein the first ground layer and the second layer include a copper layer.

6. The printed circuit board of claim 1, wherein the second ground layer includes a plurality of voids.

7. The printed circuit board of claim 1, wherein, the ground through hole vias are disposed on opposite sides of each of the ground pads, one side of the oppositely disposed sides of each ground pad corresponding to the corridor between the rows.

8. The printed circuit board of claim 1, wherein the signal layer includes a plurality of paired traces, each one of the paired traces in electrical communication with at least one of the at least two signal pads to define the current pathway.

9. The printed circuit board of claim 8, wherein the paired traces include one trace of a P potential, and one trace of an N potential.

10. A method for electric current circulation, comprising: obtaining a printed circuit board comprising:
   a first ground layer, a second ground layer, and a signal layer between the first ground layer and the second ground layer;
   the first ground layer including a plurality of oppositely disposed islands arranged in rows with a corridor between the rows of oppositely disposed islands, each said island surrounding at least two signal pads, the signal pads in electrical communication with the signal layer to define a current pathway, and a plurality of ground pads in each row at the ends of the islands in the direction of the row; and,
   a plurality of ground through hole vias, each of the ground through hole vias in electrical communication with the ground pads and extending from the first ground layer to the second ground layer to define a current return pathway;
   placing an electrical connector into electrical communication with the signal pads and the surface of the first ground layer; and,
   passing electrical current through the connector, such that 1) current flow from the electrical pads to the signal layer defines a current pathway; and, 2) current flow through the plurality of ground through hole vias extending from the first ground layer to the second ground layer defines a current return pathway.

11. The method of claim 10, additionally comprising: sinking the electrical current by the plurality of ground through hole vias.

12. A printed circuit board comprising:
   a first ground layer including: a plurality of oppositely disposed islands arranged in rows such that there is a corridor between the rows of islands, each of the islands surrounding at least two signal pads, and a plurality of ground pads, each of the ground pads disposed along one of the rows at the ends of the islands;
   a second ground layer;
   a signal layer between the first ground layer and the second ground layer, the signal layer including a plurality of ground cages with the ground pads of the first ground layer, and a plurality of paired traces, each one of the paired traces in electrical communication with at least one of the at least two signal pads to define a current pathway; and,
   a plurality of ground through hole vias, each of the ground through hole vias in electrical communication with the ground pads, and each of the ground through hole vias extending from the first ground layer to the second ground layer, the ground through hole vias defining a current return pathway.

13. The printed circuit board of claim 12 wherein the ground cages comprise:
   a conductor extending along the signal layer and aligned with the corridor on the first ground layer; and,
   a plurality of conductive leads aligned with a corresponding ground pad, and in electrical communication with the conductor and the corresponding ground pad.

14. The printed circuit board of claim 13, additionally comprising: ground shielding vias extending between the first ground layer and the second ground layer.

15. The printed circuit board of claim 12, wherein the plurality of ground through hole vias include, a plurality of through holes for sinking current.

16. The printed circuit board of claim 12, wherein the first ground layer and the second ground layer include a copper layer.

17. The printed circuit board of claim 12, wherein the second ground layer includes a plurality of voids, each of the voids in electrical communication with one of the signal pads of the first ground layer.

18. The printed circuit board of claim 12, wherein, the ground through hole vias are disposed on opposite sides of each of the ground pads, one side of the oppositely disposed sides of each ground pad corresponding to the corridor between the rows.

19. The printed circuit board of claim 18, wherein the paired traces include one trace of a P potential, and one trace of an N potential.

* * * * *